United States Patent [19]

Lade et al.

[11] Patent Number: 4,633,278
[45] Date of Patent: Dec. 30, 1986

[54] HORIZONTALLY LAYERED MOMOM NOTCH TUNNEL DEVICE

[75] Inventors: Robert W. Lade, Milwaukee; James A. Benjamin, Waukesha; Herman P. Schutten, Milwaukee, all of Wis.

[73] Assignee: Eaton Corporation, Cleveland, Ohio

[21] Appl. No.: 683,728

[22] Filed: Dec. 19, 1984

[51] Int. Cl.$^4$ .............................................. H01L 49/02
[52] U.S. Cl. ............................................ 357/6; 357/4; 357/30; 357/55; 357/56
[58] Field of Search ....................... 357/6, 4, 30, 55, 56

[56] References Cited

U.S. PATENT DOCUMENTS 3,259,759 7/1966 Giaever ............................... 357/6 X

*Primary Examiner*—Martin H. Edlow
*Attorney, Agent, or Firm*—Andrus, Sceales, Starke & Sawall

[57] ABSTRACT

MOMOM structural geometry and fabrication techniques are disclosed. A first oxidizable metal strip (3) and a second coplanar nonoxidizable metal strip (6) are deposited on an insulating substrate (2). An insulating layer (12) is deposited on the metal strips, followed by deposition of a third nonoxidizable metal layer. A generally vertical notch (14) is cut through the layers to the substrate providing left and right sections (15, 16) of the third metal layer, left and right sections (19, 20) of the insulating layer, and the first and second metal layers with facing edges (23, 24) spaced by the notch therebetween. An oxidized tip (25) is formed at the facing edge of the first metal layer. A fourth metal layer (26) is ballistically deposited over the oxidized tip and the left section of the third metal layer, using the notch edge of the right section of the third metal layer as a shadow mask, followed by oxidization of the fourth metal layer. A fifth horizontal metal layer (30) is ballistically deposited by a vertically columnated beam along the substrate across the bottom (28) of the notch between the oxidation layer on the fourth metal layer and the facing edge (24) of the second metal layer. The M-O-M-O-M structure is provided by the first metal layer (3)-the oxidized tip (25)-the fourth metal layer (26) at a generally vertical portion (39)-the oxidation layer (29) on the fourth metal layer at a generally vertical portion (41)-the fifth metal layer (30) and the second metal layer (6).

9 Claims, 15 Drawing Figures

HORIZONTALLY LAYERED MOMOM NOTCH TUNNEL DEVICE

BACKGROUND AND SUMMARY

The invention relates to metal-oxide-metal-oxide-metal, MOMOM, devices and fabrication methods.

In an MOMOM device, current is conducted by the tunneling of carriers such as electrons through the oxide barriers between the metal layers. Tunneling probability is determined by various factors, including the excitation level of the carriers, the work function and the height of the barrier between the metal and the oxide, the thickness of the oxide, etc. The MOMOM structure is analogous to a bipolar transistor, and it is desirable to have a very thin middle metal base region so that carriers surmounting the first oxide barrier from the end emitter metal will coast through the base metal layer and be collected in the end collector metal layer. It is also desirable to provide independently variable work function barrier heights and oxide thicknesses for the emitter-base junction and the base-collector junction. This enables differing input and output impedance values.

The present invention provides structural geometry and simplified efficient processing fabrication of a horizontally layered MOMOM device satisfying the above desirable characteristics and capable of operation in the visible region. Extremely small junction areas are provided, for example $10^{-10} cm^2$, capable of detecting signals in the visible wavelength region, i.e., optical frequencies can excite the carriers to cross the junction barriers.

BRIEF DESCRIPTION OF THE DRAWINGS

FIG. 1 is perspective view showing an initial processing step.

FIG. 2 is a cross sectional view taken along line 2—2 of FIG. 1.

FIG. 3 is a cross sectional view taken along line 3—3 of FIG. 1.

FIG. 4 is a view like FIG. 2, but showing a further processing step.

FIG. 5 is a view like FIG. 3, but showing the processing step of FIG. 4.

FIG. 6 is a view like FIG. 4, showing a further processing step.

FIGS. 7-10 are views like FIG. 6, but showing further processing steps.

DETAILED DESCRIPTION

Figure 1:
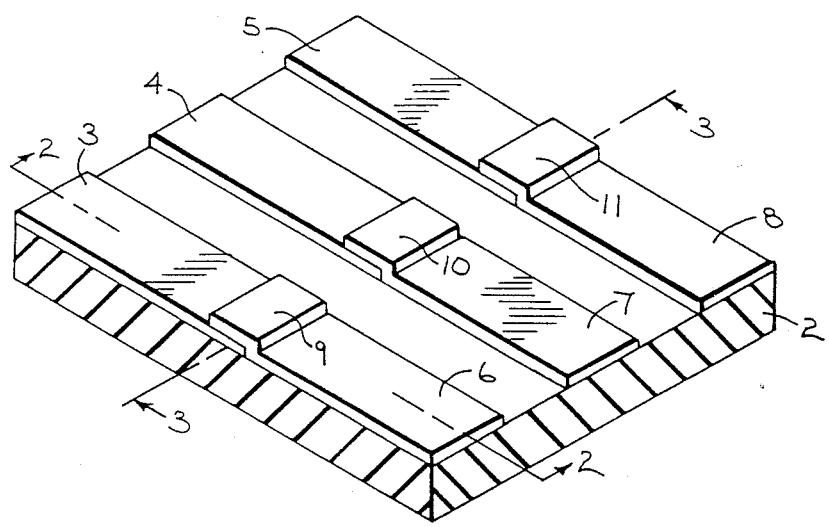
FIGS. 1-10 show sequential processing steps for fabricating an MOMOM device in accordance with the method of the invention.
Figure 2:
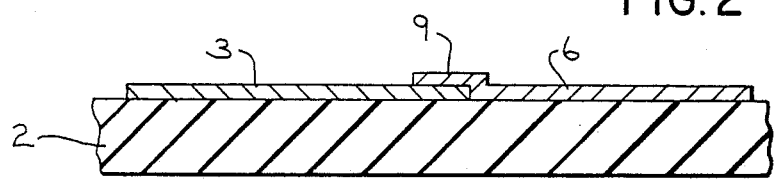
Figure 3:
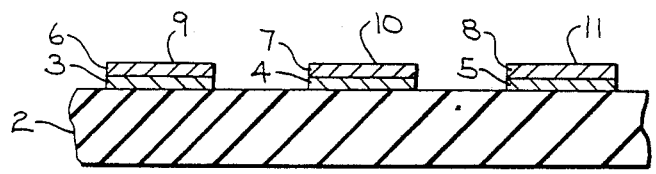

There is shown in FIG. 1 an insulating substrate 2 on which there is formed a set of first horizontal oxidizable metal layer strips 3-5, such as aluminum, and a set of second horizontal nonoxidizable metal layer strips 6-8, such as gold, coplanar with respective said first metal layers 3-5. Metal layers 6-8 are colinearly aligned with respective metal layers 3-5 and are overlapped at respective areas 9-11, FIGS. 1-3.

Figure 4:
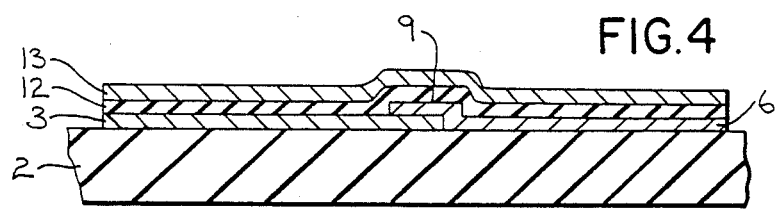
Figure 5:
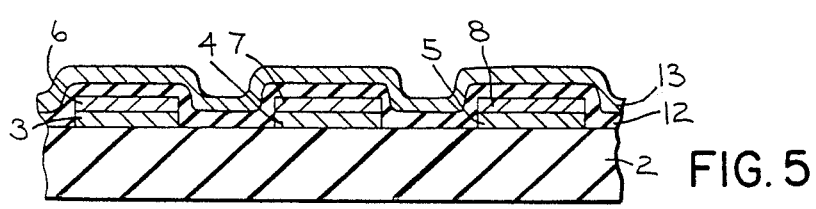
Figure 6:
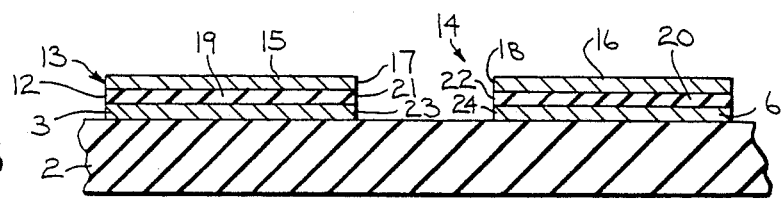

A first horizontal insulating layer 12, FIG. 4, is deposited or otherwise formed over first and second metal layers 3-5 and 6-8, FIG. 4. A third horizontal nonoxidizable metal layer 13 is deposited on insulating layer 12. A generally vertical notch 14, FIG. 6, is etched, such as by anisotropic etching, through the layers to substrate 2 to provide left and right sections 15 and 16 of metal layer 13 with facing edges 17 and 18 exposed by and separated by notch 14, left and right sections 19 and 20 of insulating layer 12 with facing edges 21 and 22 exposed by and separated by notch 14, and left and right respective first and second metal layers 3 and 6 with facing edges 23 and 24 exposed by and separated by notch 14. Notch 14 removes the area of overlap 9 between colinear metal strips 3 and 6, and likewise for strips 4 and 7, and 5 and 8. In the orientation in FIG. 1, notch 14 extends transversely acros the metal strips along section line 3—3.

Figure 7:
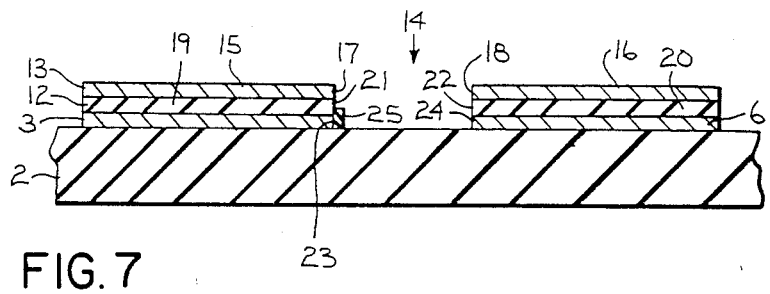
Figure 8:
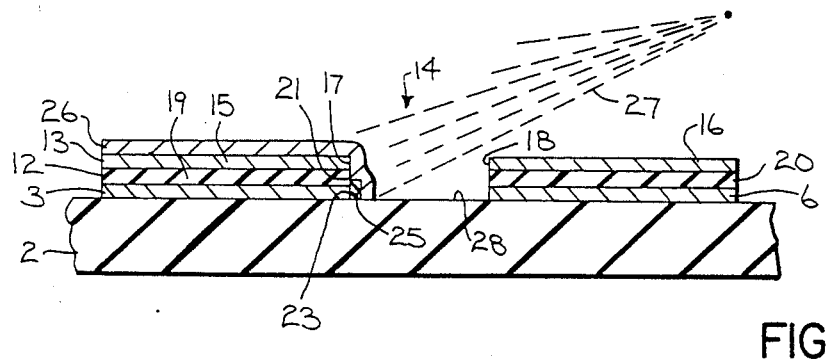

The device of FIG. 6 is next placed in an oxidizing atmosphere. Only the exposed facing edges of the first metal layer strips, such as exposed edge 23 of strip 3, are oxidized because the second metal layer strips 6-8 and the third metal layer 13, including left and right sections 15 and 16, are all nonoxidizable material. After oxidation, there is thus an oxidized tip 25, FIG. 7, formed at the exposed facing edge 23 of first metal layer strip 3, and likewise for strips 4 and 5. A fourth oxidizable metal layer 26, FIG. 8, is then ballistically deposited, as shown at projection beam 27, over the oxidized facing edge tip 25 of metal layer 3 and over the left section 15 of metal layer 13 by using the opposite facing edge 18 of right section 16 as a shadow mask for such deposition, to substantially prevent deposition of metal layer 26 along substrate 2 across the bottom 28 of notch 14. Some of the metallization 26 will likely creep a small distance rightwardly along the bottom 28 of the notch, though the shadow masking keeps it to a minimum.

The substrate is then again placed in an oxidizing atmosphere, and only the fourth metal layer 26 oxidizes, at layer 29, because layer 6 and the right section 16 of layer 13 are nonoxidizable. A fifth horizontal metal layer 30, FIG. 10, is then ballistically deposited, as shown at vertically columnated beam 31, along substrate 2 across the bottom 28 of notch 14 between oxidation layer 29 of metal layer 26 and the exposed facing edge 24 of metal layer 6.

Figure 9:
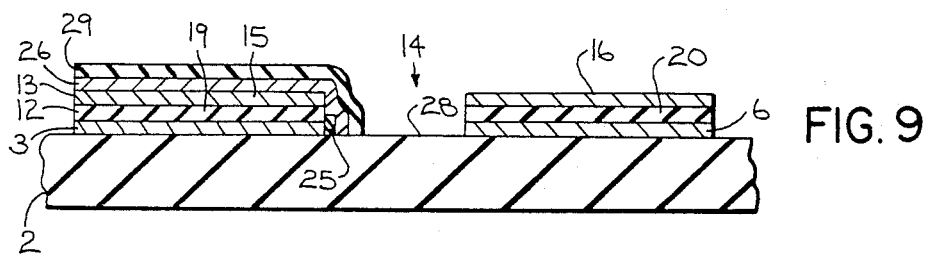

In an alternate embodiment and processing, FIGS. 12-15, where like reference numerals are used to facilitate clarity, the sidewalls of notch 14, FIG. 6, may deviate from vertical or near vertical, wherein for example the etching may proceed at a given slope sidewall aspect ratio. This is exemplified at sloped notch sidewall 32, FIG. 12. The processing of FIGS. 7-9 is followed, yielding the device shown in FIG. 12 which is identical to that in FIG. 9 except for the sloped sidewalls of the notch. Right section 20 of insulating layer 12 is then undercut etched to yield the undercut or cutout region 33, FIG. 13, beneath overhanging portion 34 of the right section 16 of metal layer 13. This is accomplished by providing first insulating layer 12 having a faster etch rate than the insulating layer 29 formed by oxidation of metal layer 26. An example of faster etch rate material is heavily phosphorous doped oxide.

Figure 14:
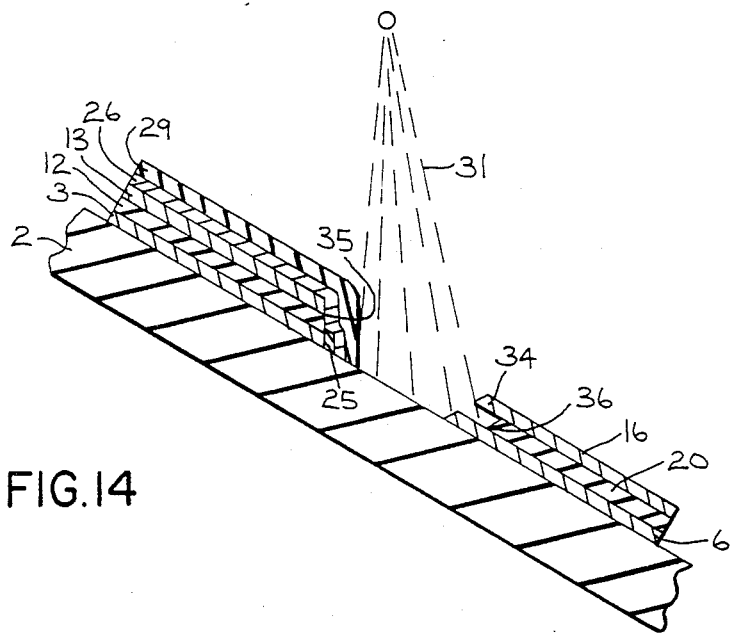

Substrate 2 is then tilted, FIG. 14, clockwise through an angle about that of the noted aspect ratio of slope 32. Metal layer 30 is then ballistically deposited by vertically columnated beam 31. Beam 31 extends substantially parallel to the left notch wall 35. The overhanging portion 34 of right section 16 of metal layer 13 is a shadow mask for the right section 20 of insulating layer 12 to prevent deposition of metal layer 30 across the exposed edge 36 of right insulating layer section 20, to prevent ohmic shorting between metal layer 6 and the right section 16 of metal layer 13. This is desirable in implementations where metal layer 13, including its right section 16, is a grounded base plane in a common base configuration.

Figure 10:
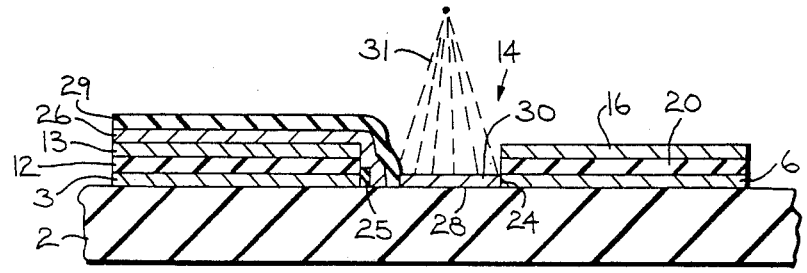
Figure 11:
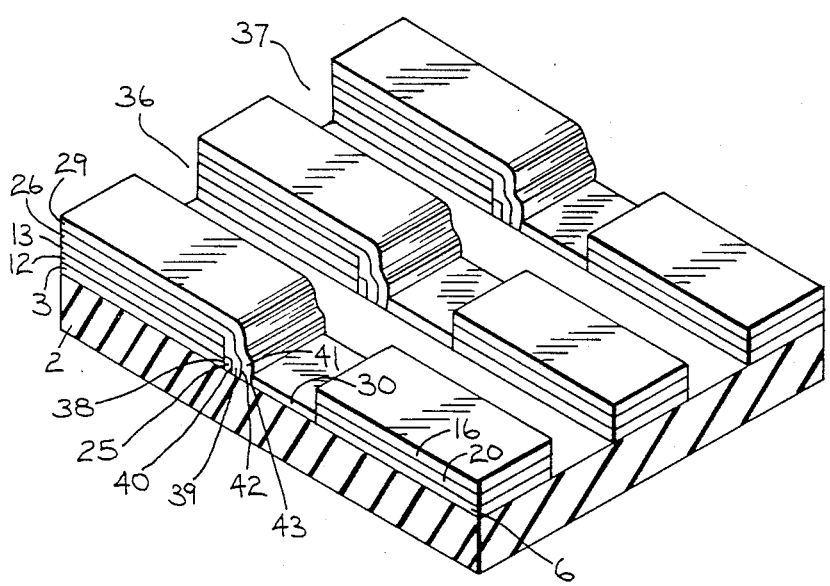
FIG. 11 is a perspective view of an MOMOM device constructed in accordance with the invention.
Figure 12:
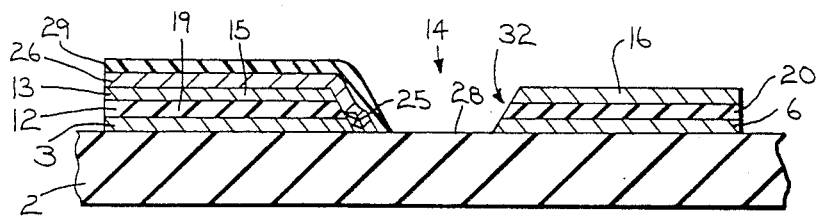
FIGS. 12-15 illustrate sequential processing steps and the resultant device therefrom in accordance with an alternate embodiment of the invention.
Figure 13:
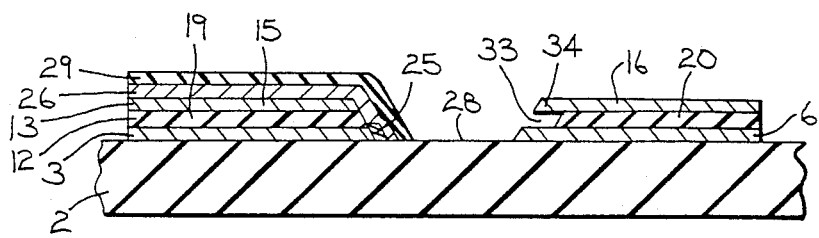
Figure 15:
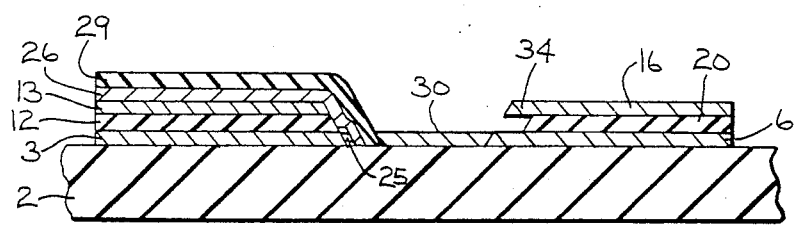

To finish the structures of FIGS. 10 or 15, longitudinal grooves 36 and 37, FIG. 11, are etched between and parallel to metal layer strips 3 and 6, 4 and 7, 5 and 8, etc. FIG. 11 shows three devices on the common substrate 2, though expansion to a high number of devices integrated on the same substrate is of course accomplished by the same noted processing. In the first device, the M-O-M-O-M structure is provided by first metal layer 3 - oxidized tip 25 - fourth metal layer 26 at portion 39 - second insulating layer 29 at portion 41 - fifth metal layer 30 and second metal layer 6. Metal layer 3 is on substrate 2. Insulating layer 25 is on substrate 2 horizontally adjacent and forming a junction 38 with metal layer 3. Metal layer 26 includes a generally vertical portion 39 on substrate 2 horizontally adjacent and forming a junction 40 with insulating layer 25. Insulating layer 29 includes a generally vertical portion 41 on substrate 2 horizontally adjacent and forming a junction 42 with metal layer portion 39. Metal layer 30 is on substrate 2 horizontally adjacent and forming a junction 43 with insulating layer portion 41. The area of junction 38 is substantially the same as the area of junction 43. The direction of layering of layers 3, 25, 39, 41 and 30 extends horizontally left-right and provides a rectilinear current path. Each of the junctions 38, 40, 42 and 43 extends vertically and laterally forward-rearward perpendicular to the noted horizontal left-right direction. Metal layers 3, 30 and 6 are substantially colinearly aligned strips extending horizontally left-right and having substantially the same vertical height and lateral width.

It is recognized that various alternatives and modifications are possible within the scope of the appended claims.

We claim:

1. An MOMOM tunnel device comprising:
    an insulating substrate;
    first and second horizontal coplanar metal layers on said substrate, said first metal layer being oxidizable metal, said second metal layer being non-oxidizable metal;
    a first horizontal insulating layer on said first and second metal layers;
    a third horizontal metal layer on said first insulating layer, said third metal layer being non-oxidizable metal;
    a generally vertical notch cut through said layers to said substrate providing left and right sections of said third metal layer, left and right sections of said first insulating layer, and left and right respective said first and second metal layers with facing edges spaced by said notch;
    an oxidized tip formed at said facing edge of said first metal layer;
    a fourth metal layer over said oxidized tip and over said left section of said third metal layer;
    a second insulating layer over said fourth metal layer; and
    a fifth horizontal metal layer extending along said substrate across the bottom of said notch between said second insulating layer and said facing edge of said second metal layer, an M-O-M-O-M structure being provided by: said first metal layer - said oxidized tip - said fourth metal layer - said second insulating layer - said fifth and second metal layers.

2. The invention according to claim 1 wherein said first and second metal layers are colinearly aligned strips having an initial area of vertical overlap removed by said notch.

3. The invention according to claim 1 wherein said oxidized tip is formed by subjecting said substrate, the facing edge of said first oxidizable metal layer exposed by said notch, the facing edge of said second non-oxidizable metal layer exposed by said notch, the facing edges of said first insulating layer exposed by said notch, and said third non-oxidizable metal layer to an oxidizing atmosphere, and wherein only said exposed facing edge of said first metal layer oxidizes.

4. The invention according to claim 1 wherein said fourth metal layer is ballistically deposited over said oxidized facing edge tip and said left section of said third metal layer, and wherein the opposite facing edge of said right section of said third metal layer provides a shadow mask for said ballistic deposition to substantially prevent deposition of said fourth metal layer along said substrate across the bottom of said notch.

5. The invention according to claim 1 wherein said fourth metal layer is oxidizable metal, and wherein said second insulating layer is formed by subjecting said fourth metal layer, the facing edge of said second metal layer exposed by said notch, the facing edge of said right section of said first insulating layer exposed by said notch, and said right section of said third metal layer to an oxidizing atmosphere, and wherein only said fourth metal layer oxidizes.

6. The invention according to claim 1 wherein the sidewalls of said notch are substantially vertical, and wherein said fifth horzontal metal layer is ballistically deposited by a substantially vertically columnated beam.

7. The invention according to claim 1 wherein the sidewalls of said notch are sloped at a given aspect ratio, and wherein said right section of said first insulating layer is undercut away from said notch beneath said right section of said third metal layer, and wherein said fifth metal layer is ballistically deposited by a columnated beam substantially parallel to the left notch wall, and wherein said right section of said third metal layer overhanging said undercut provides a shadow mask for said ballistic deposition to prevent deposition of said fifth metal layer across the exposed edge of said right section of said first insulating layer to prevent shorting of said second metal layer and said right section of said third metal layer.

8. The invention according to claim 7 wherein said substrate is tilted clockwise through an angle about that of said aspect ratio, and said fifth metal layer is ballistically deposited by a substantially vertically columnated beam.

9. An MOMOM tunnel device comprising:
    an insulating substrate;
    first and second horizontal coplanar colinearly aligned metal strips on said substrate, said first metal layer being oxidizable metal, said second metal layer being non-oxidizable metal;

a first horizontal insulating layer on said first and second metal layers;

a third horizontal non-oxidizable metal layer on said first insulating layer;

a generally vertical notch cut through said layers to said substrate providing left and right sections of said third metal layer, left and right sections of said first insulating layer with facing edges exposed by and separated by said notch, and left and right respective said first and second metal layers with facing edges exposed by and separated by said notch;

an oxidized tip at said facing edge of said first metal layer formed by subjecting said substrate, said exposed facing edge of said first metal layer, said exposed facing edge of said second metal layer, said exposed facing edges of said first insulating layer, and said left and right sections of said third metal layer to an oxidizing atmosphere, wherein only said exposed facing edge of said first metal layer oxidizes;

a fourth oxidizable metal layer ballistically deposited over said oxidized facing edge tip and said left section of said third metal layer, the opposite facing edge of said right section of said third metal layer providing a shadow mask for said ballistic deposition to substantially prevent deposition of said fourth metal layer along said substrate across the bottom of said notch;

a second insulating layer formed over said fourth metal layer by subjecting said fourth metal layer, said exposed facing edge of said second metal layer, the exposed facing edge of said right section of said first insulating layer, and said right section of said third metal layer to an oxidizing atmosphere, wherein only said fourth metal layer oxidizes; and a fifth horizontal metal layer ballistically deposited by a columnated beam and extending along said substrate across the bottom of said notch between said second insulating layer and said exposed facing edge of said second metal layer, an M-O-M-O-M structure being provided by: said first metal layer - said oxidized tip - said fourth metal layer - said second insulating layer - said fifth and second metal layers.

* * * * *